(12) United States Patent
Akaogi et al.

(10) Patent No.: US 6,353,566 B1
(45) Date of Patent: Mar. 5, 2002

(54) SYSTEM AND METHOD FOR TRACKING SENSING SPEED BY AN EQUALIZATION PULSE FOR A HIGH DENSITY FLASH MEMORY DEVICE

(75) Inventors: Takao Akaogi, Cupertino; Kazuhiro Kurihara, Sunnyvale; Thomas T. Shieh, San Jose, all of CA (US)

(73) Assignees: Advanced Micro Devices, Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/663,552

(22) Filed: Sep. 18, 2000

Related U.S. Application Data

(60) Provisional application No. 60/199,467, filed on Apr. 25, 2000.

(51) Int. Cl.[7] .............................. G11C 7/00; G11C 16/06
(52) U.S. Cl. ................... 365/203; 365/185.25; 365/202
(58) Field of Search ................................. 365/203, 202, 365/208, 189.11, 185.25, 185.33

(56) References Cited

U.S. PATENT DOCUMENTS

| | | | |
|---|---|---|---|
| 5,263,000 A | | 11/1993 | Van Buskirk et al. ...... 365/226 |
| 5,291,446 A | | 3/1994 | Van Buskirk et al. .. 365/189.09 |
| 5,612,921 A | | 3/1997 | Chang et al. ................ 365/226 |
| 5,623,446 A | * | 4/1997 | Hisada et al. .......... 365/189.11 |
| 5,708,387 A | | 1/1998 | Cleveland et al. .......... 327/536 |
| 5,886,949 A | * | 3/1999 | Villa et al. ............... 365/233.5 |
| 5,894,449 A | * | 4/1999 | Jung ........................ 365/233.5 |
| 5,986,954 A | * | 11/1999 | Pascucci ..................... 365/203 |
| 6,125,058 A | * | 9/2000 | Kuo et al. ............. 365/185.21 |

OTHER PUBLICATIONS

AMD Datasheet for Am29LV640D/Am29LV641D, (first published May 4, 1999—see revision history on last page).

AMD Press Release #9965—"AMD Announces Industry's First 3.0–Volt, 64–Megabit Nor Flash Memory Device", page 1 of 1, Apr. 26, 1999, ©1999 Advanced Micro Devices, Inc.

* cited by examiner

*Primary Examiner*—Son Mai

(57) ABSTRACT

A sense amplifier output equalization circuit for a variable operating voltage high density flash memory device is disclosed. The equalization circuit compensates for the varying sensing speeds due to the varying operating voltages by variably adjusting the duration of an equalization pulse which is used to equalize the output stage of the sense amplifier to the input stage.

18 Claims, 5 Drawing Sheets

SYSTEM AND METHOD FOR TRACKING SENSING SPEED BY AN EQUALIZATION PULSE FOR A HIGH DENSITY FLASH MEMORY DEVICE

REFERENCE TO EARLIER FILED APPLICATION

This application claims the benefit of the filing date pursuant to 35 U.S.C. §119(e) of Provisional Application Serial No. 60/199,467, filed Apr. 25, 2000, the disclosure of which is hereby incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. Jn some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integratedcircuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals two or four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

Another problem with existing flash memory devices has been the low density of storage offered as compared with traditional dynamic random access memory ("DRAM"). With the ever increasing need for storage space in modem electronic devices combined with the need to reduce the number of discrete components, there has been a corresponding pressure to increase the amount of storage available on a single flash memory device. This increase in storage density must not come at the expense of reliability.

One way to increase the storage capacity of a flash memory device is to use a core cell with a dual-level floating gate structure. Such a structure allows one core cell to represent more than one bit of information without increasing the size/area of the device. However, such dual-level core cells are difficult to design and implement because they require complex programming, erase and read logic. This is because the multiple voltage levels that can be stored in the cell now represent more than one logical value and the programming, erase and read logic must now be able to discriminate among these voltage levels. This raises concerns with the ability of the flash memory device to reliably store and retrieve data.

SUMMARY

The present invention is defined by the following claims, and nothing in this section should be taken as a limitation on those claims. By way of introduction, the preferred embodiments described below relate to a sense amplifier output equalization circuit for a high density flash memory device comprising an array of single level flash memory cells capable of operating with a variable voltage. The sense amplifier output equalization circuit comprise an equalization pulse generator coupled with the sense amplifier output and operative to generate an equalization pulse to equalize the sense amplifier output. The equalization pulse is characterized by a duration. The circuit further comprises a delay circuit coupled with the equalization pulse generator and operative to control the duration of the equalization pulse and a variable adjustment circuit coupled with the delay circuit and operative to adjust the duration as a function of the variable voltage.

The preferred embodiments also relate to a method of equalizing outputs of sense amplifier of a high density flash memory device capable of operating with a variable voltage. The method comprises: asserting an equalization signal to the sense amplifiers; deasserting the equalization signal after elapse of a variable period of time; and adjusting the variable period of time as a function of the variable voltage.

DETAILED DESCRIPTION OF THE PRESENTLY PREFERRED EMBODIMENTS

Herein, the phrase "coupled with" is defined to mean directly connected to or indirectly connected with through one or more intermediate components. Further, as used herein, the phrase "high logic level" is used to indicate a logic level of 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low" ) and some signals are asserted when they are at a high logic level (also referred to as "active high"). It will be appreciated that all forms of digital logic representation are contemplated including mixed logic. It will further be appreciated that the underlying voltages of the logic signals may also vary, with typical values being 2 or 3 Volts representing a logic 1 and 0 Volts representing logic 0.

Figure 1:
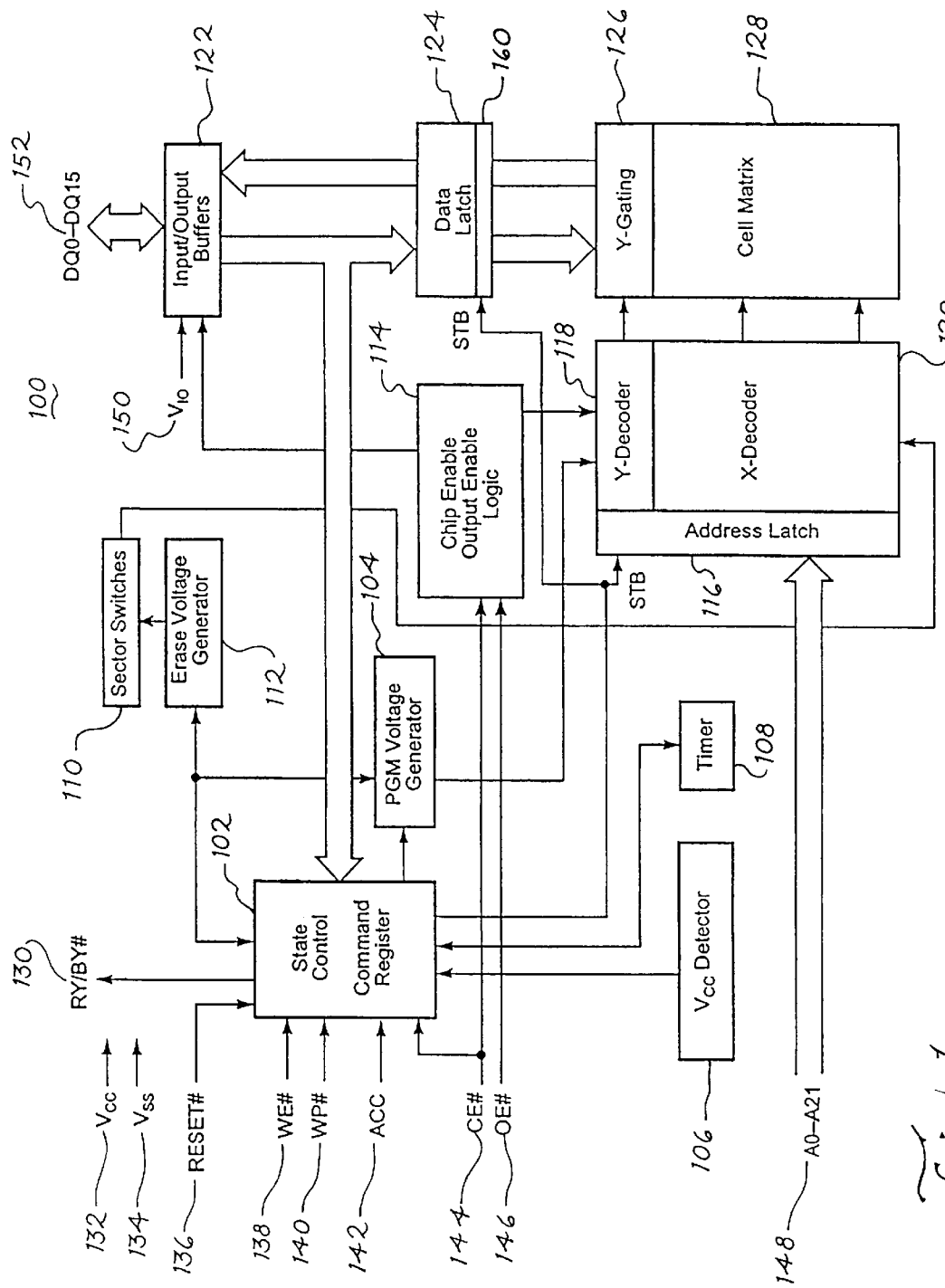
FIG. 1 depicts a block diagram of a 64 Mb flash memory chip according to the present invention.

Referring now to the Figures and in particular, FIG. 1, there is schematically shown a flash memory device 100 according to the present invention that provides 64 megabits (Mb) of storage using a single level NOR type flash memory cell. An exemplary flash memory device 100 is the Am29LV640DU and Am29LV641DU 64 Mb flash memory chips manufactured by Advanced Micro Devices, Inc., located in Sunnyvale, Calif. These devices are discussed in more detail in "Advance Information: Am29LV640DU/Am29LV641DU 64 Megabit (4 M×16-Bit) CMOS 3.0 Volt-only Uniform Sector Flash Memory with Versatile I/O™ Control," published by Advanced Micro Devices, Inc., located in Sunnyvale, Calif., herein incorporated by reference.

The exemplary flash memory device 100 utilizes a single level NOR flash memory cell which is fabricated using a 0.25 μm technology. This allows higher densities and smaller die sizes. In addition single level NOR flash memory cells require less complex programming, erase and read logic versus dual level memory cells. Further, it is easier to ensure uniform cell performance across a large array of single level NOR cells.

The device 100 includes a state control and command register 102, a program voltage generator 104, a Vcc detector 106, a timer 108, sector switches 110, an erase voltage generator 112, chip and output enable logic 114, an address latch 116, a Y-decoder 118, an X-decoder 120, input/output buffers 122, a data latch 124, Y-gating 126 and the cell matrix/array 128. The device 100 further includes inputs and outputs for ready/busy 130, labeled "RY/BY#", operating power 132, labeled "Vcc", ground 134, labeled "Vcc", reset 136, labeled "RESET#", write enable 138, labeled "WE#", write protect 140, labeled "WP#", accelerate 142, labeled "ACC", chip enable 144, labeled "CE#", output enable 146, labeled "OE#", a 22 bit address input bus 148, labeled "AO–A21", output buffer power 150, labeled "Vio", and a 16 bit data input/output bus 152, labeled "DQ0–DQ15". The # following a signal name indicates that this signal is asserted when it has a low logic value (active low). In one embodiment, all of the components of FIG. 1 are contained on a single integrated circuit chip. The operation and use of these input and output signals is further explained in the above mentioned reference. Note that the exemplary flash memory device 100, having 64 megabits (or 8 megabytes) is word addressable and therefore accommodates a 22 bit address input 148 and a 16 bit data input/output 152. It will be appreciated that the data size granularity with which the device 100 can be accessed can vary with the implementation and amount of total storage, with a smaller granularity requiring more input address bits and fewer data input/output bits and vice versa, and all such implementations are contemplated. For example, a device 100, having 64 megabits of storage, which is byte addressable requires 23 address bit inputs 148 and 8 data input/outputs 152. In another alternative, the device 100 supports both word and byte addressing on the same integrated circuit.

The state control and command register 102 includes the state machine and control logic which controls the operation of the device 100. This includes controlling the embedded programming and erase operations as well as other general operations of the device 100, which are discussed in more detail below. The state control and command register is responsive to the reset input 136, the write enable input 138, the write protect input 140, the accelerate input 142 and the chip enable input 144. The reset input is used to perform a hardware reset of the device 100. The write enable input 138 is used to signal the device 100 that data is to be stored in the array 128. The write protect input 140 is used to control the write protect functions of the device 100 which prevent accidental erasure of the contents stored in the array 128. The accelerate input 142 is used to speed up programming and erase functions. The chip enable input 144 is used to enable access to the device 100. The state control and command register further includes a ready/busy output 130 which indicates when the device is busy undergoing an embedded operation.

The PGM voltage generator 104 generates the necessary voltages for programming the flash memory cells of the cell matrix/array 128. The erase voltage generator 112 generates the necessary voltages for erasing the flash memory cells of the array 128. The voltage generators 104 and 112 contain voltage pumps (not shown) and switching multiplexors (not shown) which generate and route the necessary high voltages for erasing and programming flash memory cells as well as generating the necessary voltages for read operations under the direction of the state control and command register 102. These voltage pumps include a VPXGG pump, a voltage booster circuit, a VPPIG pump, a drain pump and a negative pump.

The VPXGG pump is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference.

During read operations, the voltage booster is used to boost the word line voltage while the drain pump is used to boost the bit line voltage prior to sensing the output voltage levels. A more detailed description of one exemplary implementation of a voltage booster circuit can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

The VPPIG pump is a high voltage pump used to pass high voltage to the drain of the memory cells. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference.

The negative pump is used to generate a relatively high negative voltage to the control gates of selected memory cells via the word lines. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

Referring back to FIG. 1, the flash memory device 100 further includes a Vcc detector 106 which detects when normal operating power is applied to the device 100. The Vcc detector 106 signals the state control and command register 102 when proper Vcc is detected. The timer 108 is used by the state control and command register 102 to properly control and synchronize the embedded program and erase operations. The sector switches 110 are used to route the voltages used during the erase operation to the proper sectors which are undergoing erase. The Chip and output enable logic 114 is responsive to the chip enable 144 and output enable 146 inputs. This logic is used to enable the device 100 to receive and pass data via the input/output buffers 122. The address latch 116 receives the address for a read or write operation from the address inputs 148. The address latch 116 latches the address for subsequent decoding. The Y-decoder 118 decodes the column address in the memory array 128 from the address latched in the address latch 116. The X-decoder 120 decodes the row address in the memory array 128 from the address latched in the address latch 116. The input/output buffers 122 buffer read data that is being output and write data that is being input to/from the external data bus 152 of the device 100. The input/output buffers receive power from an external voltage source, Vio 150. The data latch 124 latches and holds data being written to the array 128 coming from the input/output buffers 122 or data being read from the array 128 going to the buffers 122. The data latch 124 holds the data steady so it can be written or output depending on the operation underway. The Y-gating 126 gates the data being read from or written to the array 128. The cell matrix/array 128 includes an array of flash memory cells arranged in a row and column addressable format. Alternatively, the cell matrix/array 128 may include one or more banks to subdivide the accessible memory along with the additional hardware necessary to support multiple banks. The individual memory cells in the array 128 are further sub-grouped into sectors such that one or more sectors may be erased at any given time. In the exemplary flash memory device 100, the array 128 is arranged as 128 64 kilobyte sectors. It will be appreciated that there are many ways to implement the basic structure of the flash memory device 100 including alternate input/output interfaces, alternate memory array structures along with accompanying supporting logic and all such alternatives are contemplated.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state control and command register 102, which uses a command register to manage the commencement of either sequence. The erase and programming operations are only accessed via the command register which controls an internal state machine that manages device operations. Commands are written to the command register via the data inputs 152 to the memory device 100.

In the memory device 100, each memory cell, within the cell array 128, includes a single level NOR-type floating gate transistor (not shown). It will be appreciated by those skilled in the art, however, that there are many ways to implement a single level flash memory cell and that the configurations and operating characteristics may vary. It will further be appreciated that the embodiments disclosed herein are generally applicable and not limited to one particular implementation of a single level flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump. An exemplary high positive voltage applied to the source during an erase is approximately 5 volts and an exemplary high negative voltage applied to the control gate/word line by the negative pump is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply and the control gate/word line is connected to a high voltage provided by the VPXGG pump positive power supply. An exemplary high voltage applied to the drain by the VPPIG is approximately 5 Volts while an exemplary high voltage applied to the control gate by the VPXGG pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell requires higher than normal voltages, reading from the cell only requires the availability of the normal supply voltage. To read from the memory cell, the source is connected to ground (also referred to as Vss) and the control gate/word line are connected to the booster power supply. Prior to selecting the transistors for a read, the bit lines are charged up via the drain pump. When the cells turn on (if erased), they will connect their respective bit line to ground, grounding out the bit line. The current value of the memory cell is then sensed from the drain/bit line connection. The booster power supply is used to boost the word lines during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state command and control register 102. This logic 102 controls the multiplexors that place the proper voltages from the various power supplies and Vcc on the memory cell inputs depending on the desired function.

Turning to the present invention and FIG. 1, the flash memory device 100 includes an array of memory cells 128 for storing bits of data. A read sense amplifier 160 and data latch 124 reads and latches the contents of the selected memory cells of the memory array 128. The memory device 100 employs a multitude of sense amplifiers, one for each of the memory device's data input/output pins 152. Thus, where the present flash memory device 100 includes sixteen data input/output pins 152, a total of sixteen read sense amplifiers are provided. Vendors of semiconductor products are continuously pressured to develop new products that are faster than older generations and which operate with a variety supply voltages in order to satisfy market demand. The present invention satisfies this need by allowing the read time of the flash memory device 100 to be optimized to operate with different supply voltages.

Figure 2:
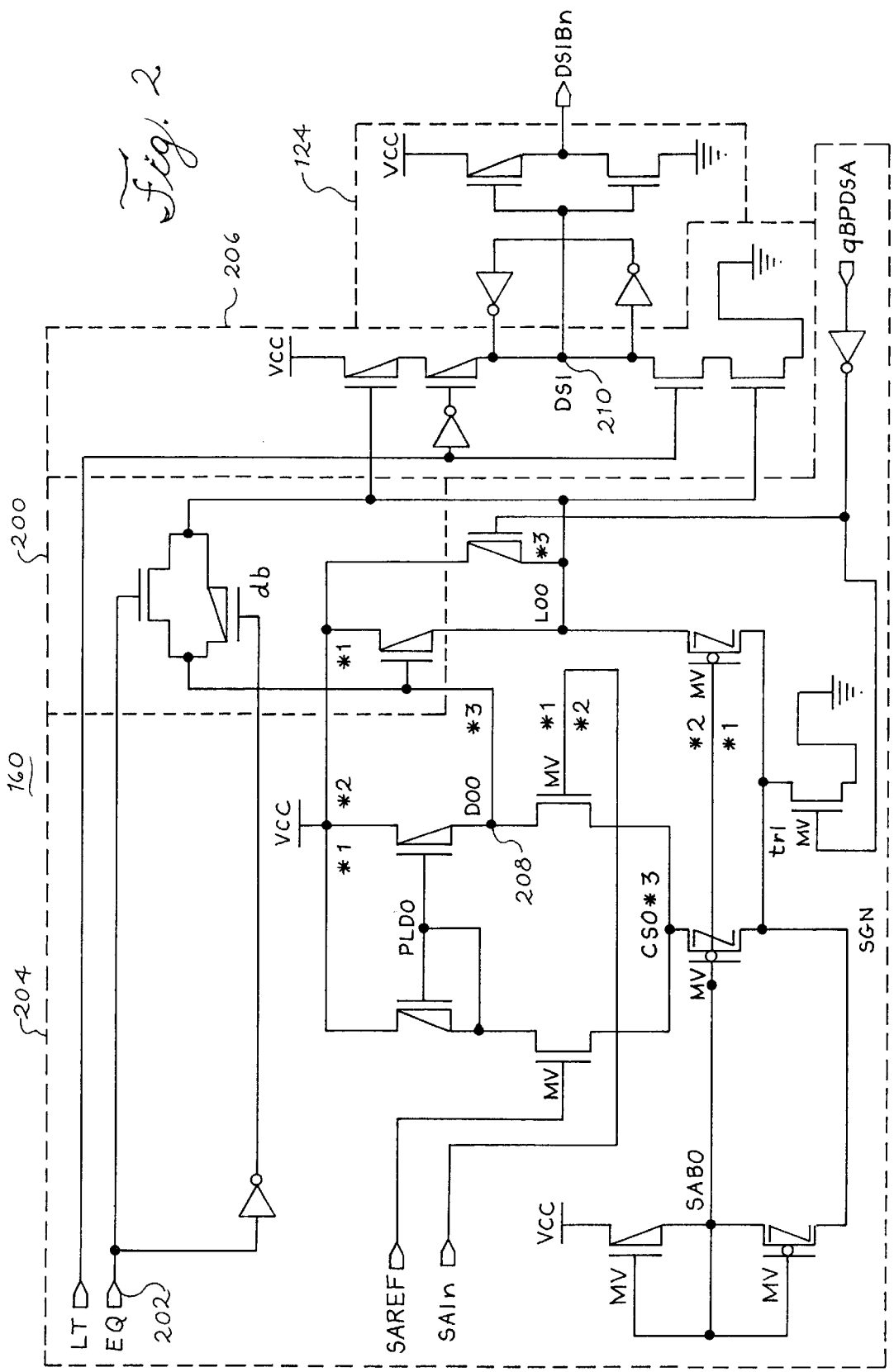
FIG. 2 depicts a schematic diagram of a sense amplifier for use with the preferred embodiments.

As shown in FIG. 2, each of the read sense amplifiers 160 include an equalization circuit 200 to increase the operating speed of the sense amplifier 160. As will be readily appreciated by one skilled in the art, the equalization ("EQ") pulse input 202 equalizes the first stage 204 and the second stage 206 of the read sense amplifier 160 by equalizing the first stage node 208 and the second stage node 210. The equalization circuit 200 is well-known in the art, therefore the principle of operation need not be explained. The equalization circuit 200 is controlled by the EQ pulse input 202, which receives an EQ pulse signal that is asserted for a specified duration during each read cycle. The durational length of the equalization pulse limits the speed at which the read sense amplifier 160 can operate. An equalization pulse 202 which is short in duration allows the read sense amplifier 160 to operate at a faster speed. On the other hand, if the equalization pulse 202 is shorter than the minimum time required to allow the equalization circuit 200 to equalize the first stage node 208 and the second stage node 210, the sense amplifier 160 will fail to operate correctly and will produce incorrect data that does not match the actual contents of the memory array 128.

Figure 3:
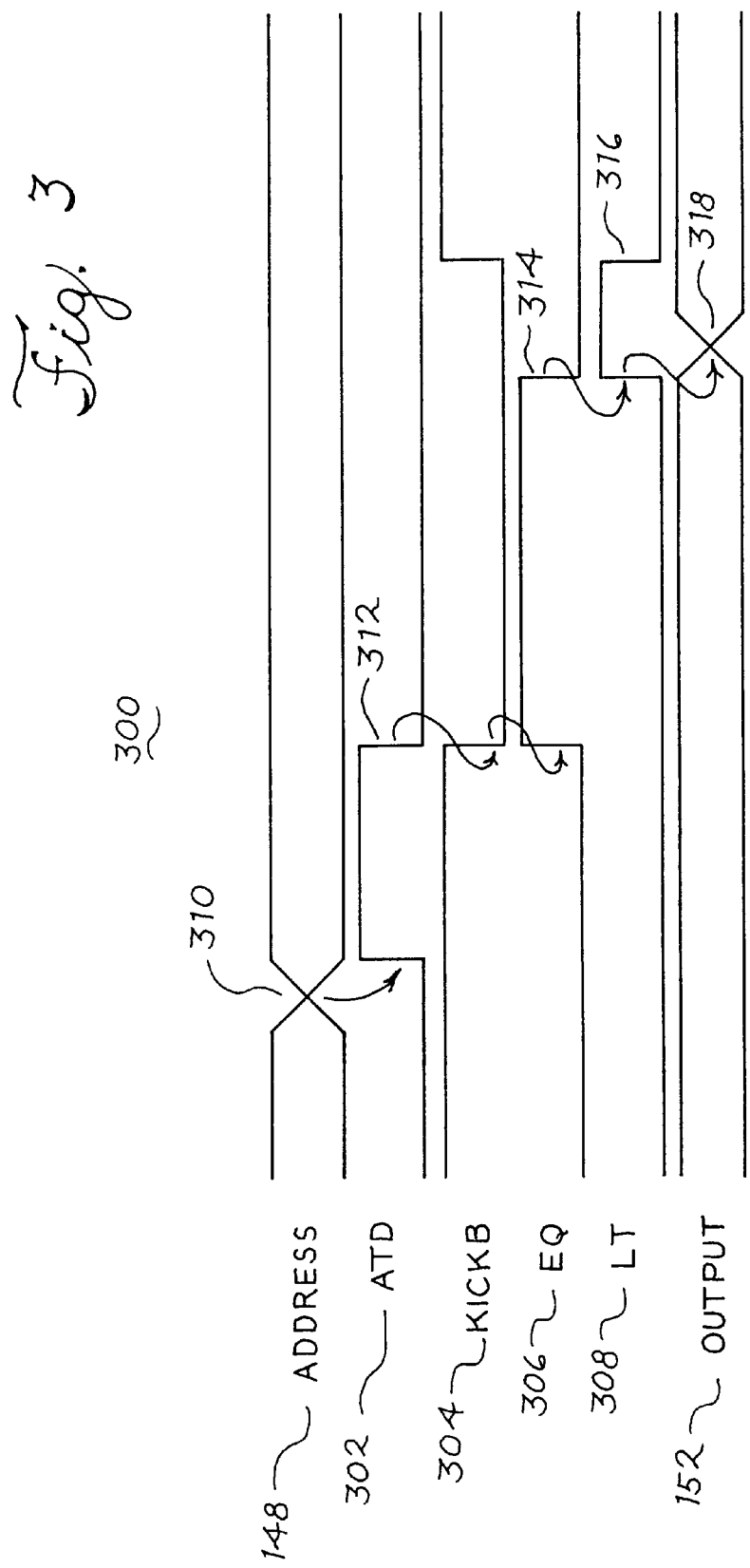
FIG. 3 depicts a read path timing diagram for the chip of FIG. 1.

Referring now to FIG. 3, there is shown a timing diagram 300 for the read path of the device 100. The read path of the device 100 is under the control of the state command and control register 102. The signals involved in the read path include the address inputs 148, an Address Transition Detect ("ATD") signal 302, a KICKB signal 304, the EQ signal 306, a Latch ("LT") signal 308 and the data outputs 152. A read operation is triggered in the device 100 when the address inputs 152 are transitioned 310 to a new address. This address transition 310 causes an ATD signal pulse 312 to be generated. The end of the ATD signal pulse 312 causes the KICKB signal 304 to be asserted which controls the power supplies 104,112 which boost the wordline voltages in the array 128 for the read operation. KICKB 304 is an active low signal. Simultaneously with the KICKB signal 304, the EQ signal 306 is asserted 314 to equalize the two stages 204, 206 of the sense amplifiers 160. Once equalized, the end of the EQ pulse 314 causes the LT signal to assert 316 which latches the output data into the data latches 124. This causes the data outputs 152 to transition 318 to reflect the read data.

Figure 4:
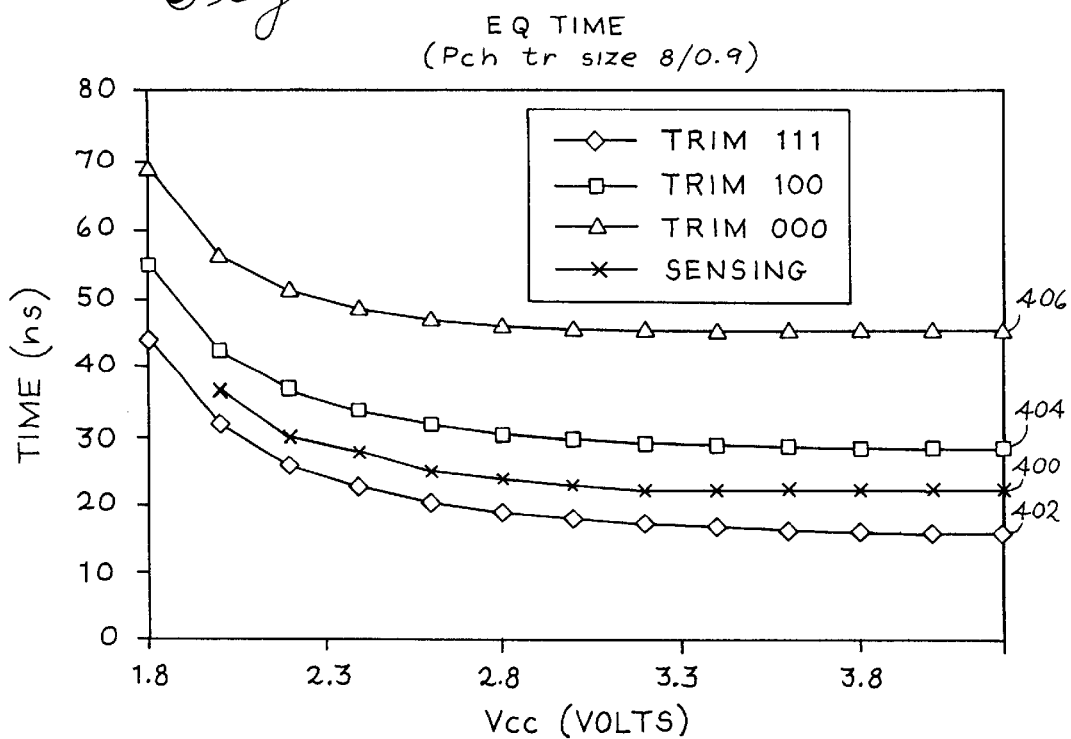
FIG. 4 depicts a graph of the sensing time and equalization pulse duration according to the preferred embodiments operating at 2 volts.

The minimum equalization time is function of the sensing speed of the sense amplifier 160. The sensing speed is the amount of time it takes for the sense amplifier to correctly read the voltage levels from the selected cells in the memory array 128. The sensing speed is a function of the operating voltage of the device 100 and the cell current. The higher the operating voltage, higher the cell current and the faster the sensing speed. The device 100 is capable of operating over a range of voltage from approximately 1.7 to approximately 3.6 volts. FIGS. 4 and show graphs which depict the sensing speed 400, 500 as a function of the input voltage. It can be seen that over the voltage range of approximately 1.7 to 3.6 volts, the sensing speed varies from about 45 to 22 nanoseconds. The equalization pulse must be greater than or equal to the sensing speed for the device to operate correctly. That is, the second stage 206 of the sense amplifier 160 must not be equalized to the first stage 204 before the sense amplifier 160 has had a chance to read the voltage values from the cells in the array. If the EQ pulse 314 ends to soon, it will trigger the LT signal too soon and the data latches 124 will latch the incorrect data.

Figure 6:
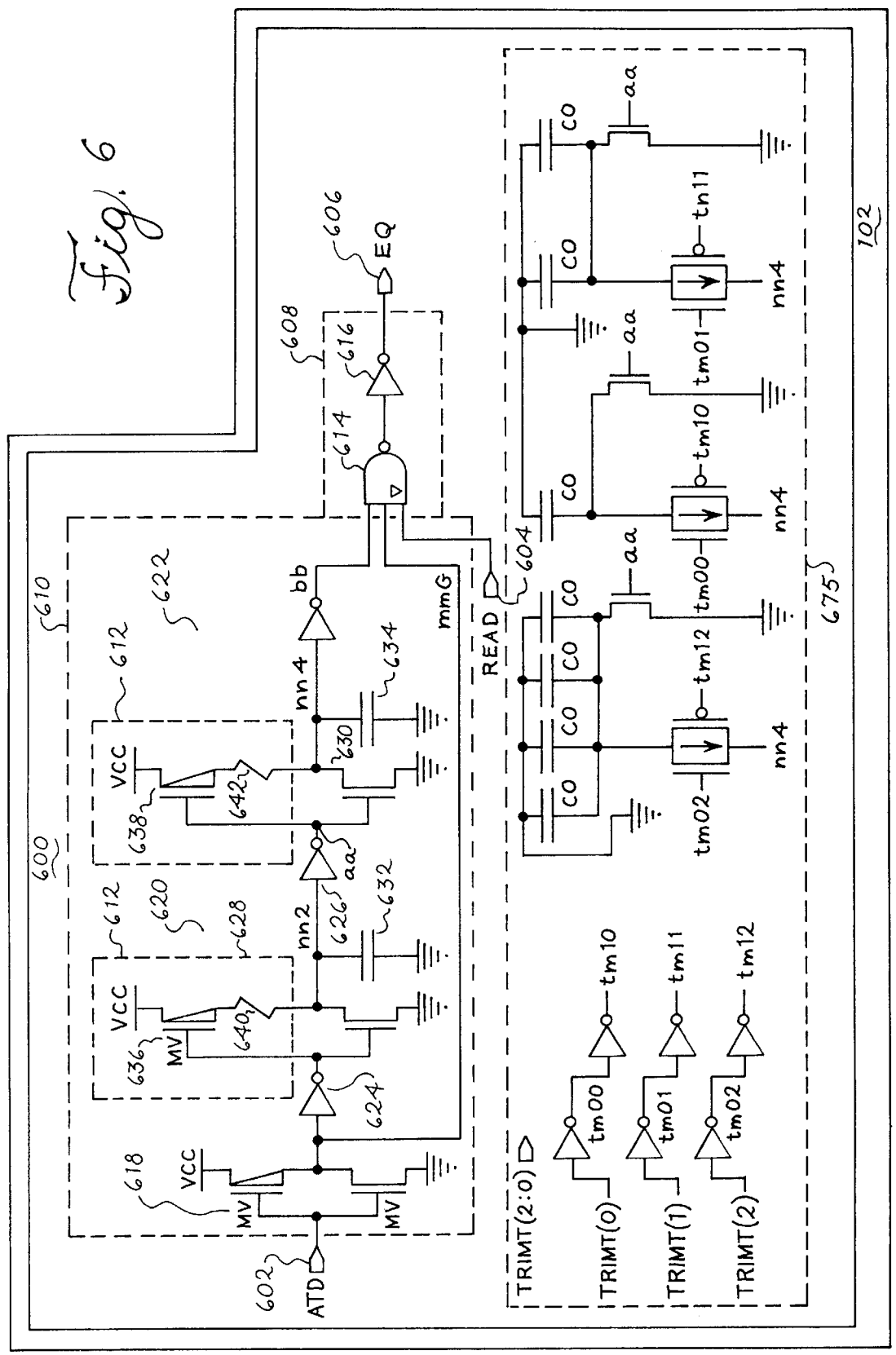
FIG. 6 depicts a schematic diagram of sense amplifier output equalization circuit according to the preferred embodiments.

In addition to the sensing speed, the optimal durational length of the equalization pulse, at which the read sense amplifier 160 operates correctly and yet as fast as possible, also depends on the manufacturing process variations of the memory device 100. Accordingly, the device 100 provides circuits 675 for fine tuning the EQ pulse duration after manufacture to account for these manufacturing process variations. These circuits 675 are shown in FIG. 6 and explained in more detail in co-pending and commonly assigned U.S. patent application Ser. No. 09/421,982 entitled "SYSTEM FOR OPTIMIZING THE EQUALIZATION PULSE OF A READ SENSE AMPLIFIER FOR A SIMULTANEOUS OPERATION FLASH MEMORY DEVICE", filed on Oct. 19, 1999, now U.S. Pat. No. 6,125,058.

Referring now to FIG. 6, there is shown the sense amplifier output equalization circuit 600 of the state command and control register 102 capable of adjusting the EQ pulse for different operating voltages. For the sake of clarity, a number of the components of the state command and control register 102 are not shown in FIG. 6. The sense amplifier output equalization circuit 600 includes an input 602 for the ATD signal, an input 604 for a read signal and an output 606 for the EQ pulse signal 306. The equalization circuit 600 further includes an equalization pulse generator 608, a delay circuit 610 and an adjustment circuit 612. The equalization circuit 600 also includes trim circuits 675 which allow fine tuning of the EQ pulse 306 to account for manufacturing process variations (discussed above and in the above mentioned reference).

The equalization pulse generator 608 includes a NAND gate 614 and an inverter 616. The NAND gate 614 has inputs for the read input 604, an input for the inverted ATD signal input 602 and an input for the output of the delay circuit 610. When all of the inputs to the NAND gate 614 are asserted, the gate 614 will assert its output which is inverted by inverter 616 and passed to the EQ pulse signal output 606.

The delay circuit 610 includes an inverter 618 and delay elements 620 and 622 connected in series. The inverter 618 inverts the ATD signal input 602 and passes the inverted signal to the NAND gate 614 of the equalization pulse generator 608 and to the first delay element 620. Each delay element 620, 622 includes an inverter 624, 626, a delayed inverter 628, 630 and a capacitor 632, 634. Each delay inverter 628, 630 includes an adjustment circuit 612.

The adjustment circuit 612 includes a p-channel transistor 636, 638 and a resistor 640, 642. The adjustment circuit 612 and the delay inverter 628, 630 delay the rise times of their respective outputs thereby introducing the delay which sets up the duration of the EQ pulse signal 306. The rise time of the outputs of the delay inverters 628, 630 is a function of the size of the p-channel transistor 636, 638 and of the operating voltage of the device 100.

Figure 5:
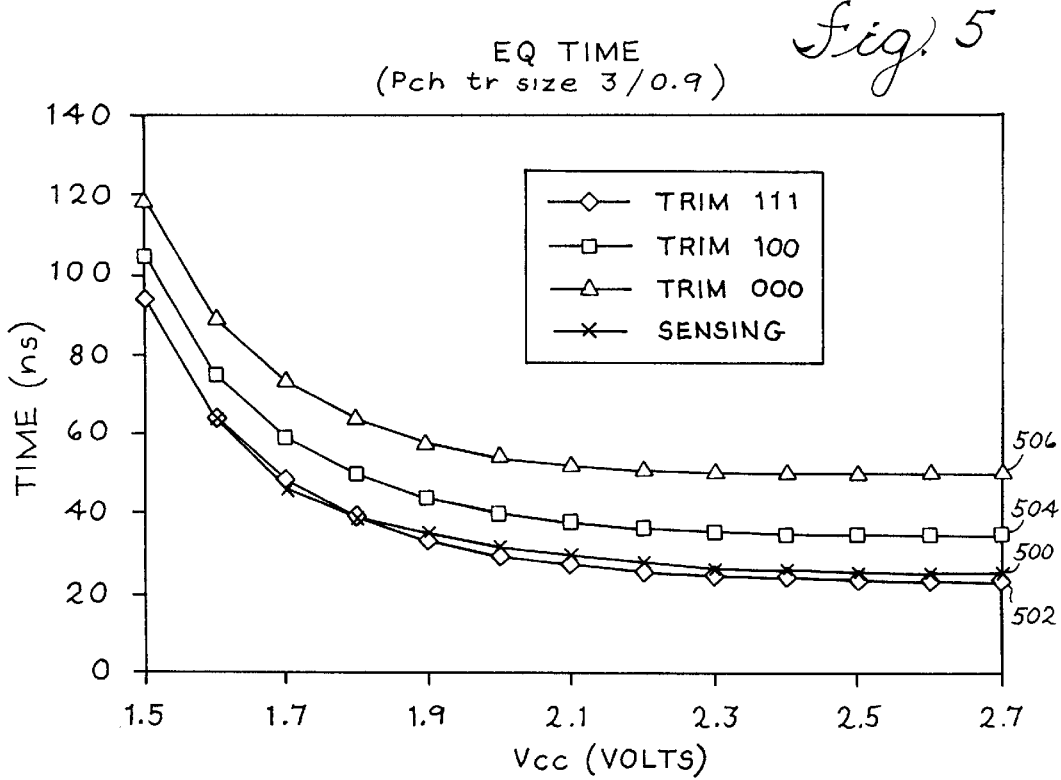
FIG. 5 depicts a graph of the sensing time and equalization pulse duration according to the preferred embodiments operating at 3 volts.

Referring back to FIG. 4, there is depicted a graph showing the EQ pulse duration times 402, 404, 406 for a transistor 636, 638 size of 8 microns long by 0.9 microns wide. Each duration time 402, 404, 406 represents a different trim level as adjusted by the trim circuits 675. As can be seen, for a given operating voltage, the EQ sensing pulse duration 404 at trim level 100 is the optimal EQ pulse duration as compared to the sensing speed 400. For a device which nominally operates at 2 volts, this represents the optimal transistor 636, 638 size Referring back to FIG. 5, there is depicted a graph showing the EQ pulse duration times 502, 504, 506 for a transistor 636, 638 size of 3 microns long by 0.9 microns wide. Each duration time 502, 504, 506 represents a different trim level as adjusted by the trim circuits 675. As can be seen, for a given operating voltage, the EQ sensing pulse duration 504 at trim level 100 is the optimal EQ pulse duration as compared to the sensing speed 500. For a device which nominally operates at 3 volts, this represents the optimal transistor 636, 638 size.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. A method of equalizing outputs of a sense amplifier of a high density flash memory device capable of operating with a variable voltage, said method comprising:
   (a) asserting an equalization signal to said sense amplifier;
   (b) deasserting said equalization signal after elapse of a variable period of time; and
   (c) adjusting said variable period of time as a function of said variable voltage.

2. The method of claim 1, wherein said device is further characterized by a minimum sensing time period, said minimum sensing time period being a function of said variable voltage. wherein (c) further comprises adjusting said variable period of time as a function of said minimum sensing time period.

3. The method of claim 2, wherein (c) further comprises adjusting said variable period of time to be greater than said minimum sensing time period.

4. The method of claim 2, wherein said (c) further comprises adjusting said variable period of time to be substantially the same as said minimum sensing time period.

5. The method of claim 2, wherein said minimum sensing time period ranges from about 25 to about 65 nanoseconds.

6. The method of claim 1, wherein said variable period of time is a function of one or more pull-up transistors.

7. The method of claim 6, wherein said one or more pull-up transistors are characterized by a size, (c) further comprising adjusting said size of said one or more pull-up transistors.

8. The method of claim 7, wherein said size ranges from about 0.9 microns wide and about 3 microns long to about 0.9 microns wide and about 8 microns long.

9. The method of claim 6, wherein (c) further comprises adding additional pull-up transistors.

10. The method of claim 6, wherein (c) further comprises reducing the number of pull-up transistors.

11. The method of claim 1, wherein (c) further comprises:
increasing said variable period of time when said variable operating voltage is low; and
decreasing said variable period of time when said variable operating voltage is high.

12. The method of claim 11, wherein said variable operating voltage ranges from about 1.7 Volts to about 3.6 Volts.

13. The method of claim 12, wherein said low variable operating voltage ranges from about 1.7 Volts to about 2.6 Volts and said high variable operating voltage ranges from about 2.7 Volts to about 3.6 Volts.

14. The method of claim 1, wherein said variable period of time ranges from about 16 to about 120 nanoseconds.

15. A sense amplifier output equalization circuit for a high density flash memory device comprising an array of single level flash memory cells capable of operating with a variable voltage, said sense amplifier output equalization circuit comprising:
an equalization pulse generator coupled with said sense amplifier output and operative to generate an equalization pulse to equalize said sense amplifier output, said equalization pulse being characterized by a duration;
a delay circuit coupled with said equalization pulse generator and operative to control said duration of said equalization pulse; and
a variable adjustment circuit coupled with said delay circuit and operative to adjust said duration as a function of said variable voltage, said variable adjustment circuit including one or more pull up transistors that are characterized by a size that ranges from about 0.9 microns wide and about 3 microns long to about 0.9 microns wide and about 8 microns long, and wherein said duration is a function of said size.

16. A sense amplifier output equalization circuit for a high density flash memory device comprising an array of single level flash memory cells capable of operating with a variable voltage, said sense amplifier output equalization circuit comprising:
an equalization pulse generator coupled with said sense amplifier output and operative to generate an equalization pulse to equalize said sense amplifier output, said equalization pulse being characterized by a duration;
a delay circuit coupled with said equalization pulse generator and operative to control said duration of said equalization pulse; and
a variable adjustment circuit coupled with said delay circuit and operative to adjust said duration as a function of said variable voltage, said variable adjustment circuit including one or more pull up transistors that are characterized by a size that is a function of said variable voltage, and wherein said variable voltage ranges from about 1.7 Volts to about 3.6 Volts.

17. A high density flash memory device capable of operating with a variable voltage, said device comprising:
an array of single level flash memory cells, said array being characterized by a sensing speed, said sensing speed being a function of said variable voltage;
at least one sense amplifier coupled to said array, said amplifier having an output stage; and
an equalization circuit coupled with said output stage, said equalization circuit comprising:
an equalization pulse generator operative to generate an equalization pulse to equalize said output stage, said equalization pulse being characterized by a duration;
a delay circuit coupled with said equalization pulse generator and operative to control said duration of said equalization pulse; and
a variable adjustment circuit coupled with said delay circuit and operative to adjust said duration as a function of said variable voltage, said variable adjustment circuit including one or more pull up transistors that are characterized by a size that ranges from about 0.9 microns wide and about 3 microns long to about 0.9 microns wide and about 8 microns long, and wherein said duration is a function of said size.

18. A high density flash memory device capable of operating with a variable voltage, said device comprising:
an array of single level flash memory cells, said array being characterized by a sensing speed, said sensing speed being a function of said variable voltage;
at least one sense amplifier coupled to said array, said amplifier having an output stage; and
an equalization circuit coupled with said output stage, said equalization circuit comprising:
an equalization pulse generator operative to generate an equalization pulse to equalize said output stage, said equalization pulse being characterized by a duration;
a delay circuit coupled with said equalization pulse generator and operative to control said duration of said equalization pulse; and
a variable adjustment circuit coupled with said delay circuit and operative to adjust said duration as a function of said variable voltage, said variable adjustment circuit including one or more pull up transistors that are characterized by a size that is a function of said variable voltage, and wherein said variable voltage ranges from about 1.7 Volts to about 3.6 Volts.

* * * * *